(12) United States Patent
Jing

(10) Patent No.: US 6,350,979 B1
(45) Date of Patent: Feb. 26, 2002

(54) CMOS IMAGE SENSOR WITH HIGH QUANTUM EFFICIENCY

(75) Inventor: Tao Jing, Fremont, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/301,428

(22) Filed: Apr. 28, 1999

(51) Int. Cl.$^7$ .......................... H01L 27/00; H01L 31/00
(52) U.S. Cl. ..................... 250/208.1; 250/214.1; 250/214 LS
(58) Field of Search ..................... 348/307, 308, 348/309; 250/208.1, 214.1, 214 LS; 257/436, 448, 457, 459

(56) References Cited

U.S. PATENT DOCUMENTS

| | | | | |
|---|---|---|---|---|
| 5,471,515 A | * | 11/1995 | Fossum et al. | 257/292 |
| 5,517,043 A | * | 5/1996 | Ma et al. | 257/229 |
| 5,608,243 A | * | 3/1997 | Chi et al. | 257/292 |
| 5,872,371 A | * | 2/1999 | Guidash et al. | 257/229 |
| 6,021,172 A | * | 2/2000 | Fossum et al. | 257/292 |

* cited by examiner

Primary Examiner—Frank G. Font
Assistant Examiner—Zandra V. Smith
(74) Attorney, Agent, or Firm—Townsend and Townsend and Crew LLP

(57) ABSTRACT

An image sensor integrated circuit with a pixel cell having photogates wherein each photogate has a number of gaps which allow light to penetrate to the substrate. The gaps are open in the direction of the floating diffusion, in order to minimize the trapping of charges. In a preferred embodiment, the floating gate has a comb structure, with the tines of the comb extending toward the floating gate. Preferably, the tines or fingers are wider than the gaps. In a preferred embodiment, the gaps are no wider than 3 microns.

7 Claims, 2 Drawing Sheets

CMOS IMAGE SENSOR WITH HIGH QUANTUM EFFICIENCY

BACKGROUND OF THE INVENTION

The present invention relates to CMOS (complementary metal-oxide silicon) image sensors, and in particular to charge coupled devices (CCDs).

There are two primary types of CMOS active pixel image sensors. The first uses a photodiode. The second uses a photogate active pixel sensor (APS). The photogate provides high conversion gain and high performance. However, the gate material itself can absorb much of the incident light, resulting in a low quantum efficiency (QE). The QE is especially bad for short wavelength light (e.g., blue light), resulting in poor image color quality.

Modern CMOS fabrication technologies are scaled to deep submicron sizes (less than 0.35 micron feature sizes). For such small sizes, polycide is typically used as a gate material. Unfortunately, polycide will degrade the QE even further due to its strong light absorption. The result of a low QE for the sensing element is that the image must be otherwise magnified, such as by using larger and more costly aperture lenses in order to provide the same quality output signal.

One approach to limiting the absorption of incident light by the gate material is to provide multiple rectangular holes in the rectangular polycide or polysilicon gate. Thus, the light is able to penetrate the gate through the holes. A disadvantage of this approach is that some of the charge underlying the holes will remain in the holes as residual charge after a charge transfer action. This can result in image smear or signal lag. The reason for the residual charge appears to be due to the higher potential under the holes caused by less effective gate modulation.

In a typical architecture, the photogate is connected to a charge coupled device stage which includes a floating diffusion as a sense node, an optional transfer gate, and the photogate. This allows the accumulated charge under the photogate to be transferred to the sensing node when the appropriate voltage is applied to the photogate. The charge transferred is then converted into a voltage by a transistor and is further read out by proper circuitry.

The charge transferred is then converted into a voltage by a transistor and is further read out by proper circuitry.

SUMMARY OF THE INVENTION

The present invention provides an image sensor integrated circuit with a pixel cell having photogates wherein each photogate has a number of gaps which allow light to penetrate to the substrate. The gaps are open in the direction of the floating diffusion sense node, in order to minimize the trapping of charges.

In a preferred embodiment, the photogate has a comb structure, with the tines of the comb extending toward the floating diffusion. Preferably, the tines or fingers are wider than the gaps. In a preferred embodiment, the gaps are no wider than 3 microns.

In the present invention, although the potential across the whole photogate area is not uniform, the potential along the charge transferring direction is uniform. Thus, the trapping and loss of charge is minimized. Another advantage of the invention is that a higher QE is provided due to the ability to provide more open area than a scheme using holes as in the prior art.

For a further understanding of the nature and advantages of the invention, reference should be made to the following description taken in conjunction with the accompanying drawings.

DESCRIPTION OF THE SPECIFIC EMBODIMENTS

Figure 1:
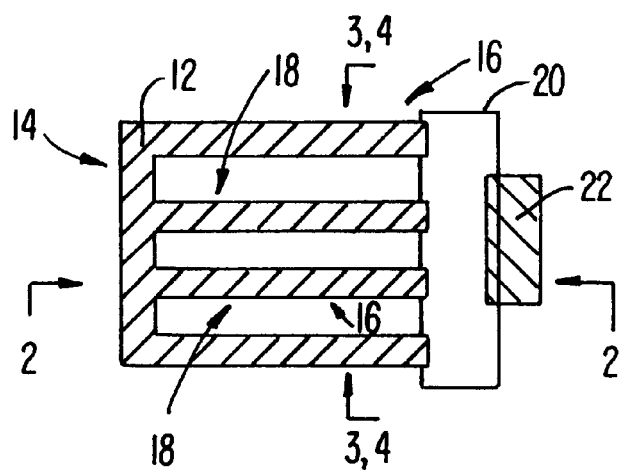
FIG. 1 is a top-view diagram of a comb-structure photogate according to an embodiment of the invention.

FIG. 1 illustrates a photogate 12 formed in a comb-shape, with a backbone portion 14 and a plurality of fingers or tines 16. In-between the fingers are gaps 18. The fingers extend to an optional transfer gate 20 and a floating diffusion 22. The photogate 12 is typically made of polysilicon or polycide.

Figure 2:
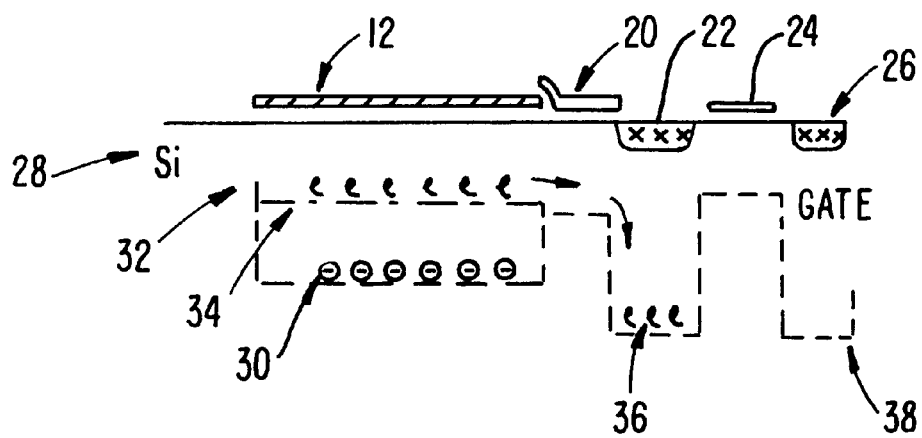
FIG. 2 is a side view of the photogate of FIG. 1.

FIG. 2 is a side view along the lines indicated as "FIG. 2" in FIG. 1. As can be seen, FIG. 2 shows the photogate 12 connected by the optional transfer gate 20 to the floating diffusion (sensing node) 22. Also shown is a metal wire 24 connected to a gate 26 of an output transistor. The gate is shown over a silicon substrate 28. Underlying the photogate, charge accumulates as illustrated by charges 30. The gaps in the photogate allow incident light to reach the substrate, generating charges in the form of electron-hole pairs. At low bias, charges 32 illustrate the charge potential level underlying the fingers 16 of the photogate. Charge level 34 illustrates the charge underlying the gaps 18 between the fingers. As illustrated, this charge can be transferred into a potential region 36 of the floating diffusion, and then transferred out to a region 38 underneath the gate 26 of the output transistor.

Although a comb structure is shown, any other structure which provides an open gap to the floating diffusion, and thus allows the escape of charge, could be used. For example, the gaps could be wider near the floating diffusion than they are at the other side of the photogate. There is a trade-off on the size of the gap, since a wider gap will provide less control for a small electrical sign. Preferably, any individual gap is no larger than 3 microns. In one embodiment, the finger size is approximately 0.6 microns, while the gap is approximately 1 micron. The size of the backbone 14 can vary, and the backbone could be metal in one embodiment.

The present invention improves the QE and allows a high amplitude signal for the same pixel area, thus improving the signal-to-noise ratio. The invention maintains the sensitivity for blue light response, which is important for reconstruction of color tone and purity. By enhancing the QE, the imaging system can use low cost optics, and hence have a lower overall cost. The invention is particularly useful for deep submicron technologies, but could be used for other fabrication technologies as well.

Figure 3:
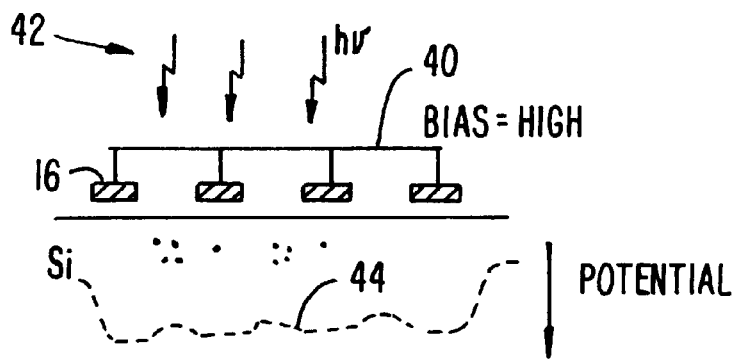
FIGS. 3 and 4 are sectional views of the gate of FIG. 1 illustrating the effect of different voltage potentials.
Figure 4:
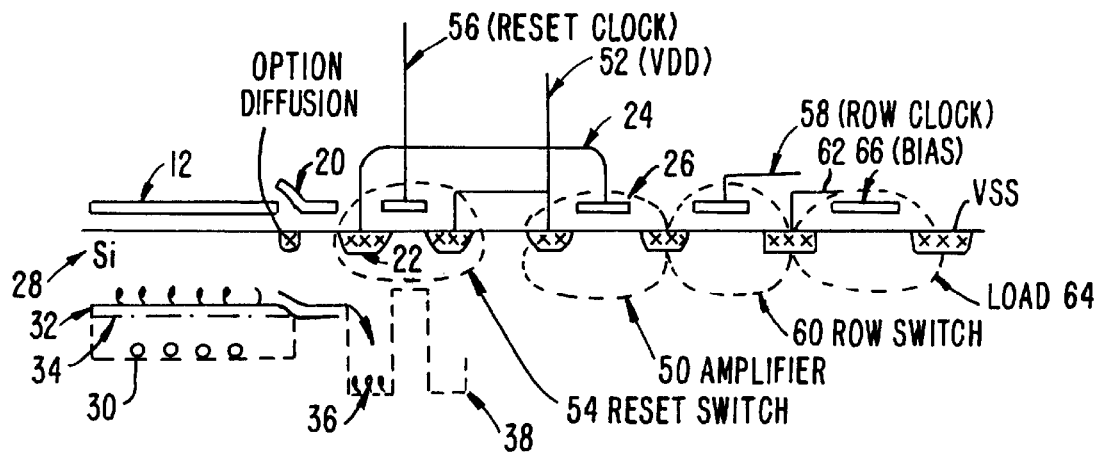

FIGS. 3 and 4 show views along lines "FIGS. 3, 4" of FIG. 1. FIG. 3 illustrates the fingers 16 of the photogate with a high bias 40 applied. The impinging light 42 will penetrate and create a higher potential, with charge going down to a depth illustrated by line 44.

In FIG. 4, in contrast, a lower bias signal 46 results in a lower potential to a depth illustrated by line 48.

Figure 5:
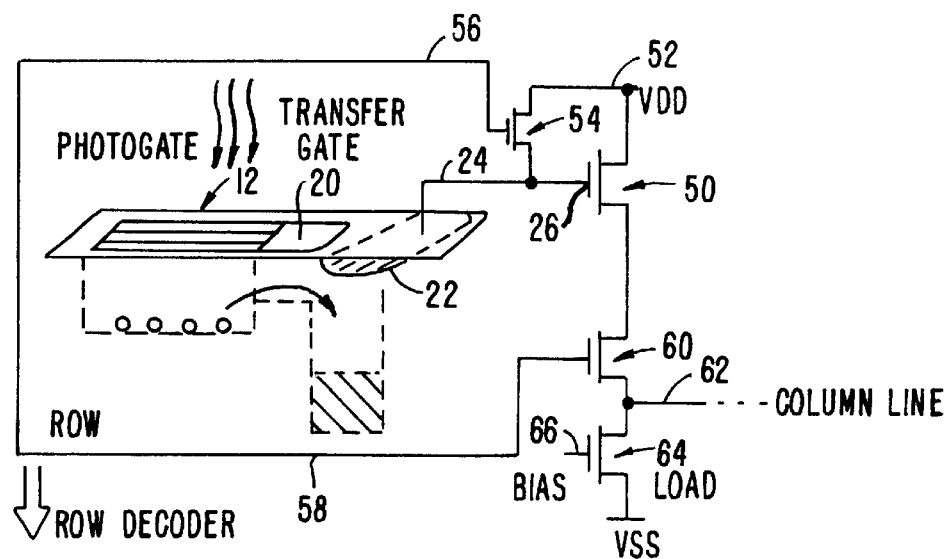
FIG. 5 is a circuit diagram illustrating the photogate of FIG. 1 in photo cell.

FIG. 5 is a diagram of a photo cell illustrating the photogate 12, optional transfer gate 20, floating diffusion and sensing node 22, conducting wire 24, and output transistor gate 26. As can be seen, gate 26 is part of an output transistor 50 connected to a voltage supply 52. A reset switch transistor 54 has its gate connected by line 56 reset clock.

Row line 58 connects to a select transistor 60, which connects the output to a column line 62, which is loaded by a loading transistor 64 connected to a bias voltage 66.

As can be seen, line 56 connected to the row line activates transistor 54, applying voltage VDD to sense node 22.

As will be understood by those of skill in the art, the present invention may be embodied in other specific forms without departing from the spirit or essential characteristics thereof. For example, the comb structure could have fewer or more fingers and wider or narrower gaps. In addition, it could be made of silicon, polycide, or other material. Additionally, the gap-shape need not be rectangular. Accordingly, the foregoing description is intended to be illustrative, but not limiting, of the scope of the invention which is set forth in the following claims.

What is claimed is:

1. An imaging integrated circuit, comprising:
   a plurality of pixel cells, each pixel cell including
      a substrate portion configured to accumulate photon-generated electric charge,
      a photogate over said substrate portion,
      a floating diffusion sense node adjacent said photogate,
      an output transistor connected to said floating diffusion sense node, and
      wherein said photogate forms a plurality of gaps allowing light to penetrate to said substrate portion without having to pass through said photogate, said gaps extending toward said floating diffusion without being blocked by any portion of said photogate.

2. The circuit of claim 1 wherein said photogate is formed in a comb structure.

3. The circuit of claim 1 wherein said photogate is formed of polycide.

4. The circuit of claim 1 further comprising:
   a transfer gate between said photogate and said floating diffusion.

5. The circuit of claim I wherein said photogate comprises a plurality of fingers defining said gaps, said fingers being wider than said gaps.

6. The circuit of claim 1 wherein each of said gaps is no wider than three microns.

7. An imaging integrated circuit, comprising:
   a plurality of pixel cells, each pixel cell including
      a substrate portion configured to accumulate photon-generated electric charge,
      a photogate over said substrate portion,
      a floating diffusion sense node adjacent said photogate,
      an output transistor connected to said floating diffusion sense node, and
   wherein said photogate is a comb structure with a plurality of fingers forming a plurality of gaps allowing light to penetrate to said substrate portion without having to pass through said photogate, said gaps extending toward said floating diffusion without being blocked by any portion of said photogate, said fingers being wider than said gaps.

* * * * *